(12) United States Patent
Liaw

(10) Patent No.: US 7,269,056 B1
(45) Date of Patent: Sep. 11, 2007

(54) POWER GRID DESIGN FOR SPLIT-WORD LINE STYLE MEMORY CELL

(75) Inventor: Jhon Jhy Liaw, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 11/412,752

(22) Filed: Apr. 27, 2006

(51) Int. Cl.
*G11C 11/00* (2006.01)

(52) U.S. Cl. ............... 365/154; 365/156; 257/903
(58) Field of Classification Search ............... 365/154, 365/156; 257/903
See application file for complete search history.

(56) References Cited

U.S. PATENT DOCUMENTS 6,535,453 B2 *  3/2003  Nii et al. ............... 365/156
6,590,802 B2 *  7/2003  Nii ........................ 365/156

* cited by examiner

*Primary Examiner*—Huan Hoang
(74) *Attorney, Agent, or Firm*—Haynes and Boone, LLP

(57) ABSTRACT

Disclosed is an improved power grid design for split-word line style memory cell. An array of memory cells comprises a first metal layer for local interconnections; a second metal layer for a bit line, a complementary bit line, and a first voltage line located between the bit line and the complementary bit line; a third metal layer for a first plurality of second voltage lines, and a word line located between the first plurality of second voltage lines, each running substantially in a first direction; and a fourth metal layer for a second plurality of second voltage lines, each running in a second direction orthogonal to the first direction.

21 Claims, 9 Drawing Sheets

POWER GRID DESIGN FOR SPLIT-WORD LINE STYLE MEMORY CELL

BACKGROUND

The present disclosure relates in general to semiconductor devices, and more particularly, to power grid designs and/or memory devices.

The use of split-word line (SWL) style memory cells, such as are used in embedded static random access memory (EBSRAM), provide several different advantages. These advantages include lithography friendly patterns on critical layers such as poly-1 and metal-1, and a high speed bit-line structure. The high speed bit-line structure is due, in part, to various items, including having a relatively low length-to-width ratio of the bit lines, and having the bit lines on a lower metal layer (i.e., nearer the substrate) with as few level changes as possible.

A problem occurs when having the bit lines on a lower metal layer. For example, a typical design of an SWL memory cell includes a first metal layer (M1) that supports the direct connections to the SWL memory cell devices; a second metal layer (M2) that supports a power supply (e.g., Vcc) and bit lines; and a third metal layer (M3) that supports a power supply (e.g., Vss) and word lines. The second metal layer M2 can be come very crowded due not only to the lines, but to contacts for receiving and connecting to interlayer vias and landing pads to the first metal layer M1.

This crowding problem is exacerbated when a shrink is performed. After a shrink, the landing pad size and/or alignment must be maintained to allow for the required design-rule requirements. Furthermore, issues may arise from lithography capability and misalignment.

What is needed is a new metal layer design that solves one or more of the above-listed problems. Also what is needed is a more robust power grid design.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
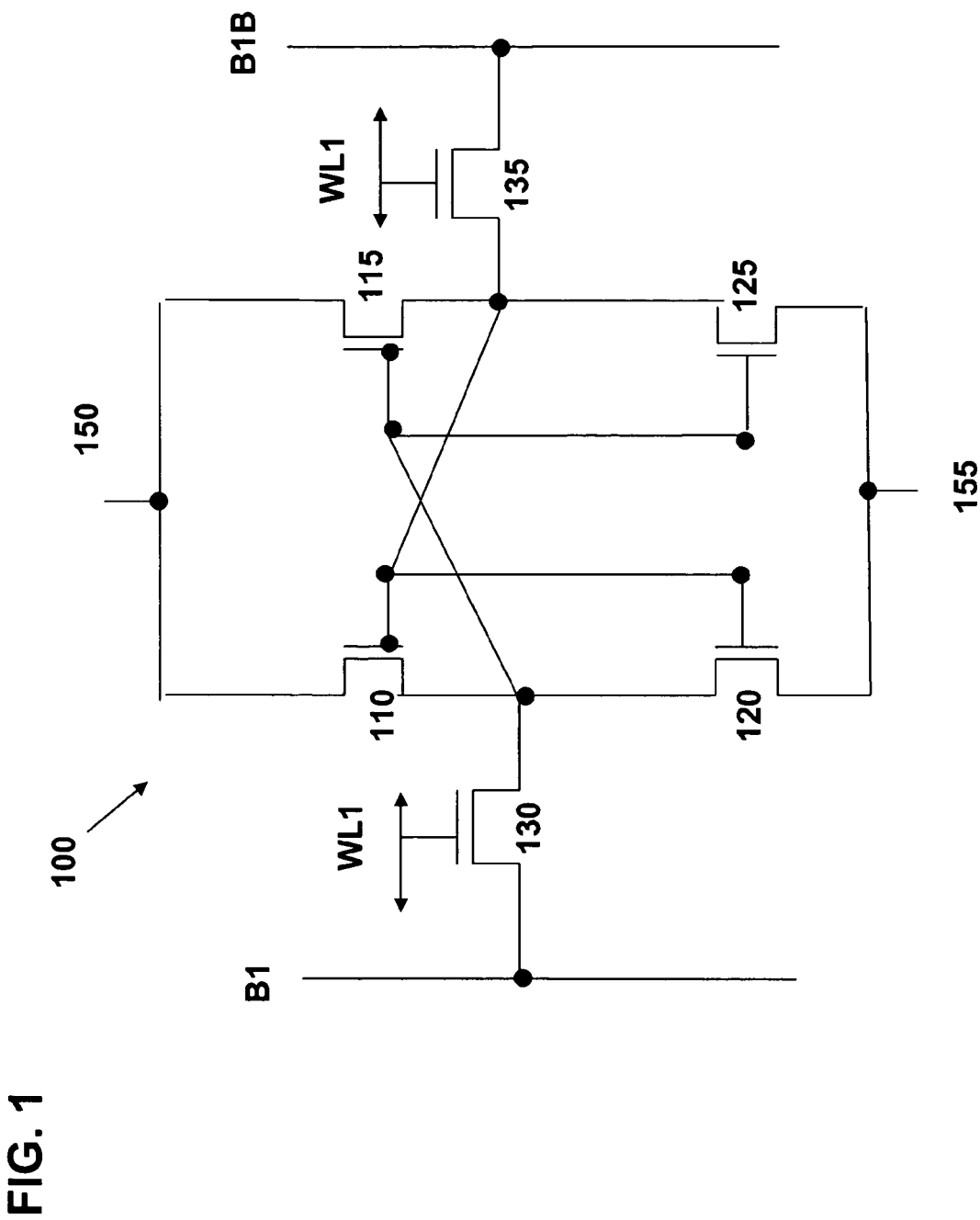
FIG. 1 illustrates a circuit diagram of one embodiment of a memory cell.

It is to be understood that the following disclosure provides different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not itself dictate a relationship between various embodiments and/or configurations discussed. Moreover, the formation of a first feature over or on a second feature in the description that follows may include embodiments in which the first and second feature are formed in direct contact, and may also include embodiments in which additional features may be formed by interposing the first and second features such that the first and second feature may not be in direct contact. Also, it is understood that the present disclosure includes many conventional structures that are well known in the art so they will only be described generally.

Referring to FIG. 1, illustrated is a circuit diagram of one embodiment of a memory cell circuit. The circuit shown is an embodiment of an SRAM memory cell, the cell designated by reference numeral 100. The cell comprises a circuit that has 2 cross-latch CMOSFET inverters forming a flip-flop and two pass gate transistors (also known as pass transistors, access transistors, active transistors). Specially, the device 100 includes pull-up transistors 110, 115, and pull-down transistors 120, 125, as well as pass gate transistors 130, 135. Pull-up transistors as defined in this disclosure can be transistors that pull either towards Vcc or Vss. In this embodiment, the memory cell functions by the pull-up transistors 110 and 115 pulling toward Vcc.

The sources of pull-up transistors 110, 115 are electrically coupled to a power source (hereinafter referred to as Vcc) 150. The drain of the pull-up transistor 110 is electrically coupled to the source of the pass gate transistor 130, the drain of pull-down transistor 120, and the gate of pull-up transistor 115. Similarly the drain of pull-up transistor 115 is electrically coupled to the source of pass gate transistor 135, the drain of pull-down transistor 125, and the gate of pull up resistor 110. The sources of the pull-down transistors 120, 125 are electrically coupled to a ground, common or Vss (herein after referred to as Vss collectively) 155. Additionally, the gates of pull-up transistor 110 and pull-down transistor 120 and the gates of pull-up transistor 115 and pull-down transistor 125 respectively are electrically coupled.

The drains of pass gate transistors 130, 135 are electrically coupled to a read/or write port bit line B1 and a complementary read/or write port bit line B1B, respectively. The gates of the pass gate transistors 130, 135 are electrically coupled to a word line WL1. The read port bit lines B1, B1B and the word line WL1 may extend to other SRAM cells and or other components including other memory cells.

Figure 2:
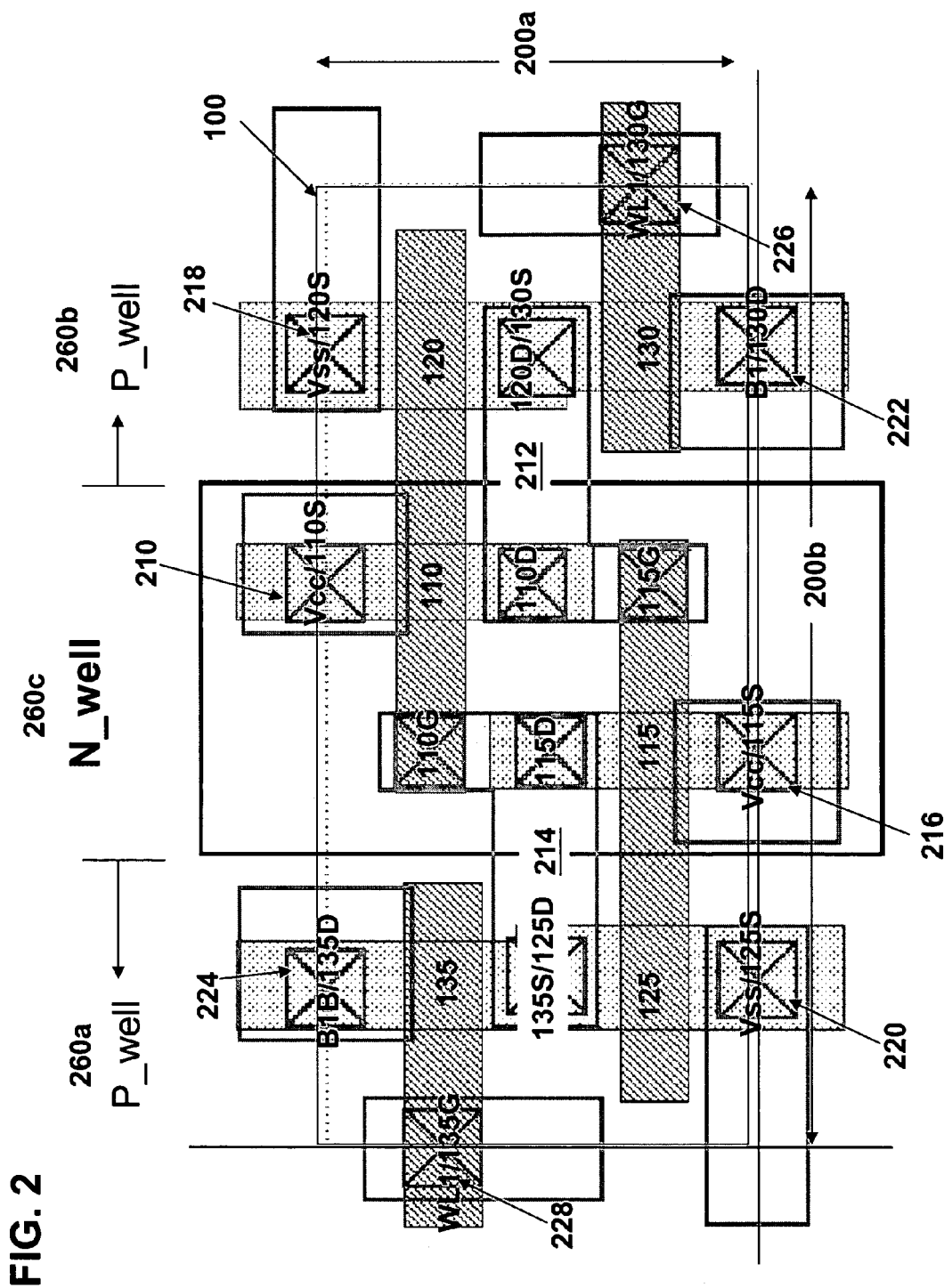
FIG. 2 illustrates one embodiment of a layout view of a memory cell shown in FIG. 1.

Referring to FIG. 2, the memory cell 100 includes an N_well region 260c interposing P_well regions 260a and 260b that are parallel to a width 200a of the cell 100.

Memory cell 100 has a length 200b across P_well regions 260a, 260b, and N_well region 260c. In FIG. 2, a contact 210 connects the pull-up transistor source node 110S to a power source Vcc 150. A contact 212 connects the pull-up transistor drain node 110D to the pass gate transistor source node 130S, the pull-down transistor drain node 120D, and the pull-up transistor gate node 115G. Similarly, a contact 216 connects the pull-up transistor source node ll5S to a power source Vcc 150. A contact 214 connects the pull-up transistor drain node 115D to the pass gate transistor source node 135S, the pull-down transistor drain node 125D, and the pull-up transistor gate node 110G. Contacts 218 and 220 connects the pull-down transistor source nodes 120S, 125S to a ground, common or Vss 155, respectively.

Although not shown in FIG. 2, the bit lines B1, B1B also run parallel to the width of the cell, while the word line WL1 runs perpendicular. In the present embodiment, the bit lines and word lines are run in metal layers shown in the following figures. A contact 222 connects the pass gate transistor drain node 130D with bitline B1, a contact 224 connects the pass gate transistor drain node 135D with bitline B1B, a contact 226 connects the pass gate transistor gate node 130G with wordline WL1, and a contact 228 connects the pass gate transistor gate node 135G with wordline WL1. P_well 260a supports transistors 135 and 125, while P_well 260b supports transistors 120 and 130. N_well region 260c supports transistors 110, 115. It is understood, however, that various other layouts would be evident to one skilled in the art.

Figure 3:
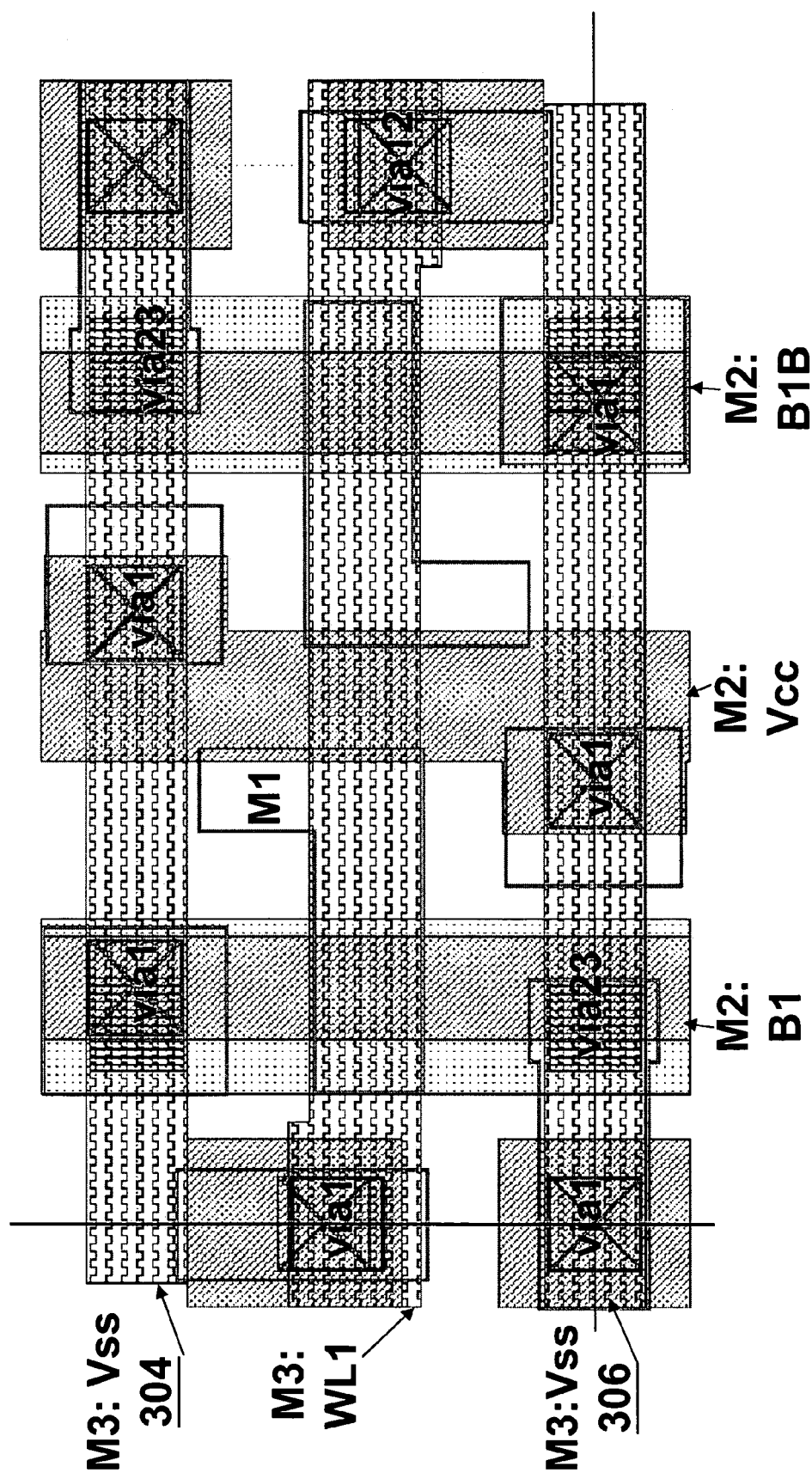
FIG. 3 illustrates one embodiment of a layout view of a memory cell in a subsequent stage of manufacturing.

Referring to FIG. 3, the memory cell 100 in FIGS. 1 and 2 is illustrated in a subsequent stage of manufacturing with three metal layers M1, M2, and M3. The first metal layer, M1, serves as a CMOS inverter drain node connection layer. The first metal layer also provides the landing pads of Vcc, Vss, word lines, and bit lines. A second metal layer, M2, serves as a conductive layer for Vcc, bit line (B1), and complementary bit line (B1B). A third metal layer, M3, serves as a conductive layer for Vss and word lines, such as WL1. In this example, word line WL1 is located between a first Vss line 304 and a second Vss line 306. Currently, first Vss line 304 and second Vss line 306 are continuous.

In the context of the present disclosure, the terms "contact" and "via" are used interchangeably. The third metal layer, M3, is electrically coupled to a source node of a pull down transistor, such as pull-down transistor 125, or a gate of a pass gate transistor, such as pass gate transistor 145, via a path. The path comprises a contact between the second and third layers (Via23), second metal layer landing pad, a contact between the first and second layers (Via 12), first metal layer landing pad, and the contact layer, The first, second, and third metal layers follow a sequence from the lowest metal layer to the highest metal layer.

In addition, the third metal layer, M3, serves as Vss node horizontal connection layer and local word line conductive layer. Thus, for a connection between word line WL1 to the gate of a pass gate transistor, such as pass gate transistor 135 in FIG. 1, a path from a third metal layer landing pad to a contact between the second and third layers (Via23), a second metal layer landing pad, a contact between first and second layers (Vial 2), a first metal layer landing pad, and the contact layer is located within a predetermined region.

Unit memory cell 100, however, faces a landing margin issue on word line WL1 of the second metal layer landing pad and the contact between second and third layers (Via23), and thus impacts the shrink capability. The landing margin issue is due to a metal pitch limit and a limit extension rule that exists between the second and third metal layers to the contact between the two layers (Via23) in the predetermined region. In addition, a shrinkage issue exists in the second metal layer landing pad. A second layer landing pad connects the second metal layer to the substrate in a gap between the gates of the transistors. The shrinkage issue is caused by the layout of the second metal layer being a contact hole pattern. The contact hole pattern exposes a portion of the landing pad to the storage electrode. Thus, because the second metal layer is a metal line rich layout, the real landing pad area is smaller than the original layout and the problem gets worse with each generation. Furthermore, an open issue also exists between word line WL1 of the second metal layer and the contact between second and third metal layers (Via23). The open issue becomes a problem in lithography processing with the possibility of misalignment.

Figure 4:
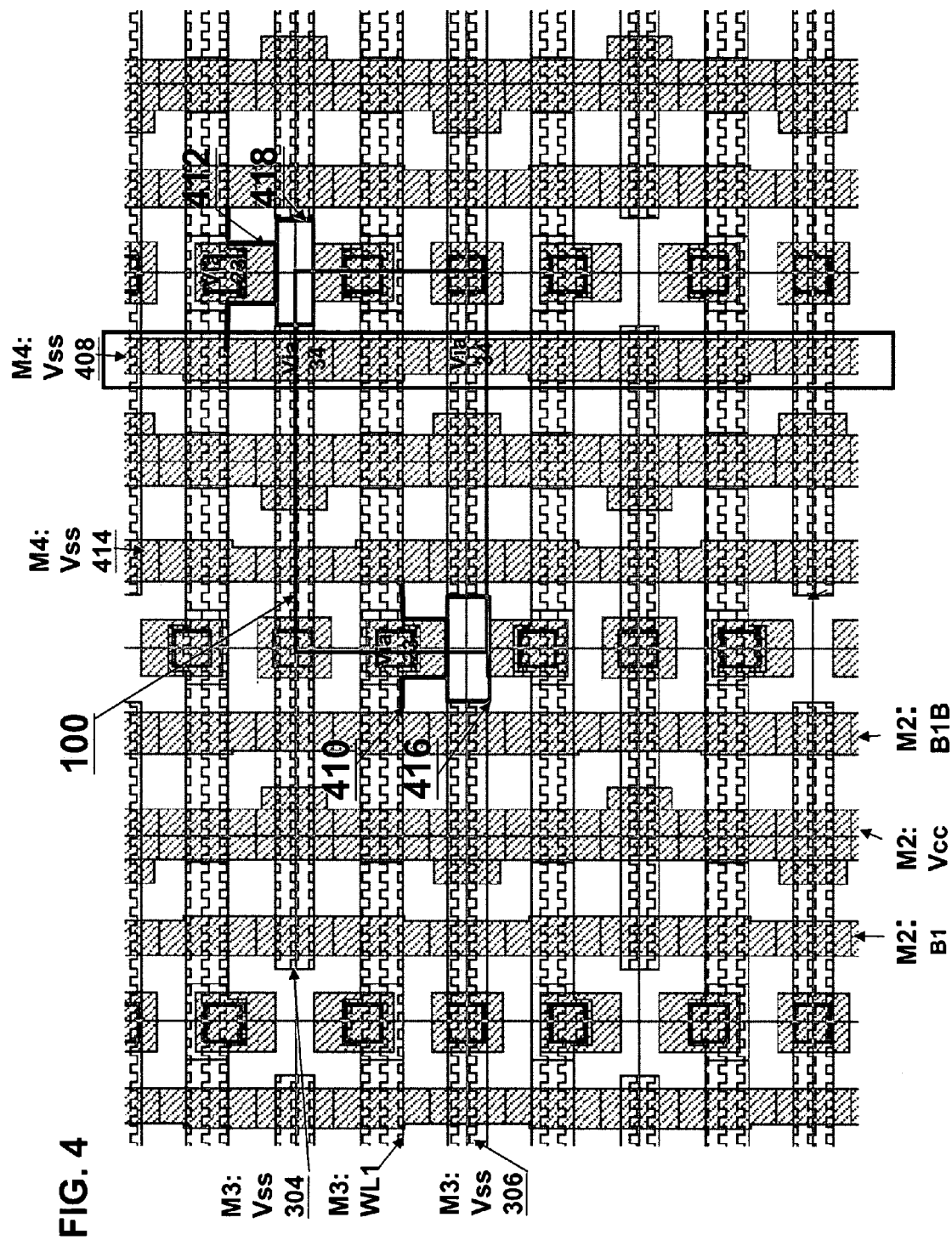
FIG. 4 illustrates one embodiment of a layout view of a memory cell in a subsequent stage of manufacturing with an improved power grid design.

FIG. 4 shows one embodiment of a layout view of memory cell 100 in FIG. 1 in a subsequent stage of manufacturing with an improved power grid design. This improved power grid design provides a lower word line RC delay and a more stable memory cell. As shown in FIG. 4, aspects of the present disclosure provide a new layout for unit memory cell 100. Unit memory cell 100 may be implemented as a thin style cell structure, which comprises two cross-coupled inverters having a data storage node and a data bar storage node. Each of the two cross-coupled inverters comprises a pull-up device, such as pull up transistor 110, and a pull-down device, such as pull down transistor 120. In addition, unit memory cell 100 comprises pass gate devices, such as pass gate transistors 130, 135, for read/write switching. Furthermore, unit memory cell 100 may have a N_well region between two P_well regions.

In an illustrative embodiment, unit memory cell 100 has a rectangular shape. Unit memory cell 100 comprises a first metal layer for cell interconnect purposes and a second metal layer that is located upon the first metal layer, which serves as a conductive layer for Vcc, bit line (B1) and complementary bit line (B1B), with Vcc located between B1 and B1B. Bit line (B1) and complementary bit line (B1B) follow a direction of the short side of the rectangle. Unit memory cell 100 also comprises a third metal layer located upon the second metal layer that serves as a conductive layer for word line WL1 and Vss lines 304, 306. Word line WL1 has a bent shape and is located between Vss lines 304 and 306. In one embodiment, the bit line-to-word line length ratio is less than one half for the purpose of high bit line speed, short bit line, and lower bit line coupling capacitance.

Vss lines 304 and 306 in memory cell 100 are discontinuous and across two unit memory cells. In addition, Vss lines 304 and 306 follow the layout direction of word line WL1, which is a horizontal direction. Word line WL1 in FIG. 4 comprises jog shapes 410 and 412 at the boundaries of unit memory cell 100, where contacts between second and third metal layers (Via23) are located. The discontinuous portions 416 and 418 of Vss lines 304 and 306 are closely located to jog shapes 410 and 412, respectively. By having discontinuous portions 416 and 418, word line landing margin problems may be minimized since more landing margin is now present between the word line conductive layer and the gate electrode of the pass gate device.

Unit memory cell 100 further comprises a N_well region between a plurality of P_well regions. The third metal layer is a conductive layer for a P_well voltage conductive line. P_well voltage conductive line follows a direction perpendicular to the bit line and is electrically coupled to an outer P_well voltage control circuit. In addition, the third metal layer is a conductive layer for a N_well voltage conductive line and follows a direction perpendicular to the bit line. The N_well voltage conductive line is electrically coupled to the first core supply voltage line.

Furthermore, unit memory cell 100 comprises a fourth metal layer, M4, which serves as a higher conductive layer for Vss. The fourth metal layer is located upon the third metal layer, M3, and comprises one or more Vss line 408. Vss line 408 is continuous and follows a direction that is perpendicular to word line WL1. Vss line 408 is electrically coupled to Vss lines 304 and 306 via contacts between third and fourth metal layers (Via34). In this way, Vss may be provided to the third metal layer, even though Vss lines 304 and 306 are discontinuous. In one embodiment, Vss lines 304 and 306 are electrically coupled to a source node of a pull down transistor, such as pull-down transistor 125.

In another embodiment, unit memory cell 100 comprises a first plurality of Vss lines, Vss 304 and 306, and a second plurality of Vss lines, Vss 408 and 414. Vss lines 408 and 414 follow a direction that is perpendicular to Vss lines 304 and 306. In an alternative embodiment, all of Vss lines 304, 306, 408, and 414 are electrically coupled to each other and to a Vss node, such as Vss 155. In addition, the fourth metal layer, M4, may comprise a second Vcc line that follows the direction of the first Vcc line in the second metal layer. The second Vcc line is electrically coupled to the first Vcc line.

Figure 5:
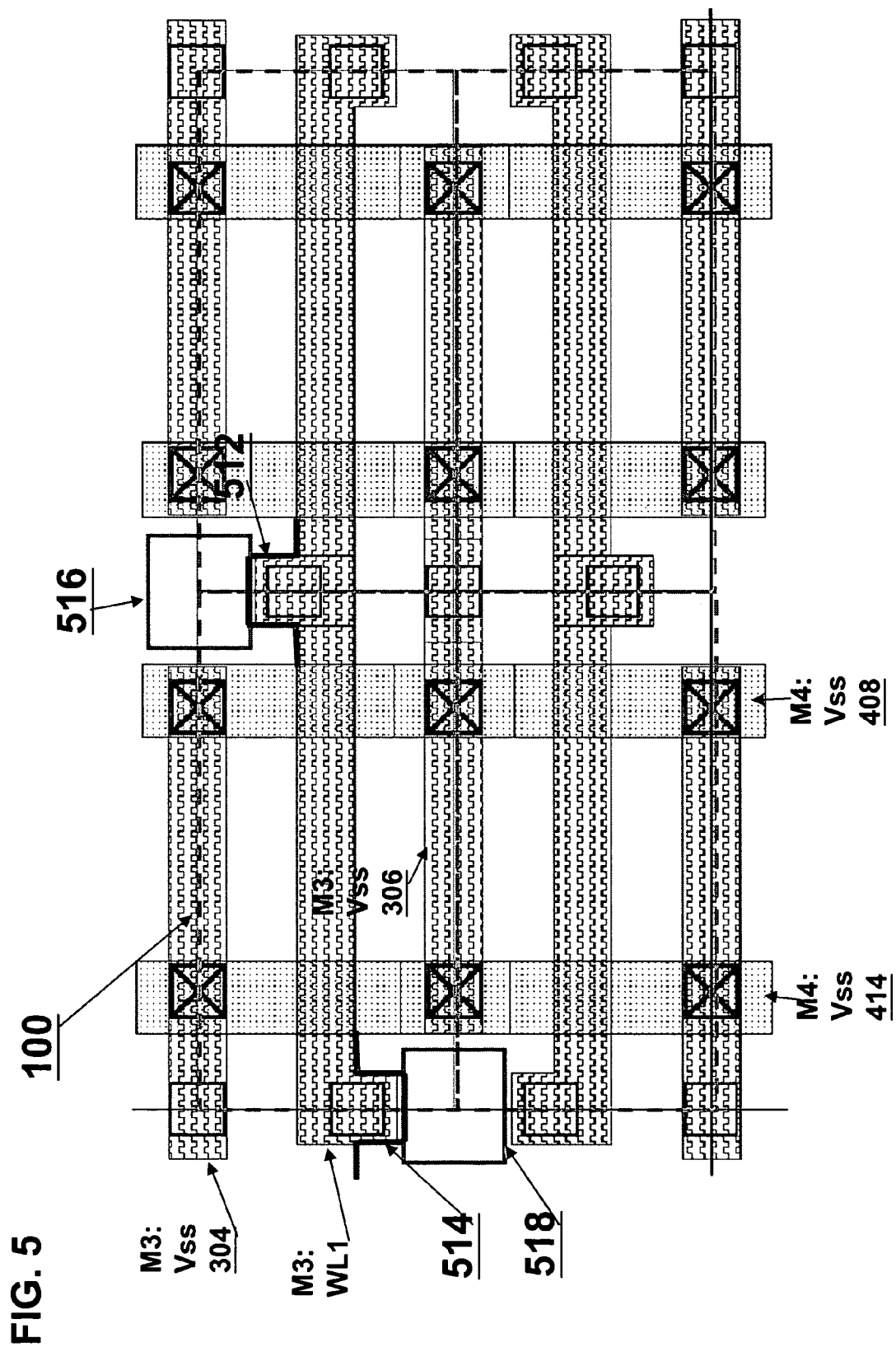
FIG. 5 illustrates a more detailed layout view of a memory cell in a subsequent stage of manufacturing with an improved power grid design.

FIG. 5 shows a more detailed layout view of a memory cell with an improved power grid design. As shown in FIG. 5, four unit memory cells 100 are present. Each unit memory cell 100 may be implemented as a thin style cell structure, which comprises two cross-coupled inverters having a data storage node and a data bar storage node. Each of the two cross-coupled inverters comprises a plurality of pull-up devices, such as pull up transistors 110 and 115, and a plurality of pull-down devices, such as pull down transistor 120 and 125. Each pull-up and pull-down device comprises a drain node and a source node. In addition, each unit memory cell 100 comprises pass gate devices, such as pass gate transistors 130, 135, for read/write switching. Furthermore, each unit memory cell 100 may have a N_well region between two P_well regions.

In an illustrative embodiment, each unit memory cell 100 has a rectangular shape. Each unit memory cell 100 also comprises a first metal layer for cell interconnect purposes and a second metal layer that is located upon the first metal layer, which serves as a conductive layer for Vcc, bit line and complementary bit line. Vcc is located between the bit line (B1) and the complementary bit line (B1B). Bit line (B1) and complementary bit line (B1B) follow a direction of the short side of the rectangle. In an illustrative embodiment, Vcc line is electrically coupled to a source node of the plurality of pull-up devices.

In addition, each unit memory cell 100 also comprises a third metal layer that serves as a conductive layer for word line and Vss lines. In this example, within the third metal layer, unit memory cell 100 comprises Vss lines 304 and 306. Vss lines 304 and 306 are discontinuous and have lengths across two unit memory cells. In addition, Vss lines 304 and 306 follow the direction of word line WL1, which is a horizontal direction. Word line WL1 has a bent shape and is located between Vss lines 304 and 306. In one embodiment, the bit line to word line length ratio is less than one half for the purpose of high bit line speed, short bit line, and lower bit line coupling capacitance.

Word line WL1 has jog shapes 512 and 514 at the boundaries of unit memory cell 100, where contacts between second and third metal layers (Via23) are located. The discontinuous portions 516 and 518 of Vss lines 304 and 306 are closely located to jog shapes 512 and 514, respectively. By having discontinuous portions 516 and 518, word line landing margin problems may be minimized since more landing margin is now present between the word line conductive layer and the gate electrode of the pass gate device.

In an illustrative embodiment, Vss line 304 is electrically coupled to the source node of a first pull-down device in the plurality of pull down devices, while Vss line 306 is electrically coupled to the source node of the second pull-down device in the plurality of pull down devices. In addition to Vss lines 304 and 306, unit memory cell 100 comprises a fourth metal layer, which serves as a higher conductive layer for Vss. The fourth metal layer is located upon the third metal layer, and comprises Vss line 414 and 408. Vss lines 414 and 408 are continuous and follow a direction that is perpendicular to word line WL1. In an illustrative embodiment, Vss line 414 and 408 are electrically coupled to Vss lines 304 and 306 via contacts between third and fourth metal layers (Via34). In one embodiment, all of Vss lines 304, 306, 414, and 408 are electrically coupled to each other and to a Vss node, such as Vss 155.

Figure 6:
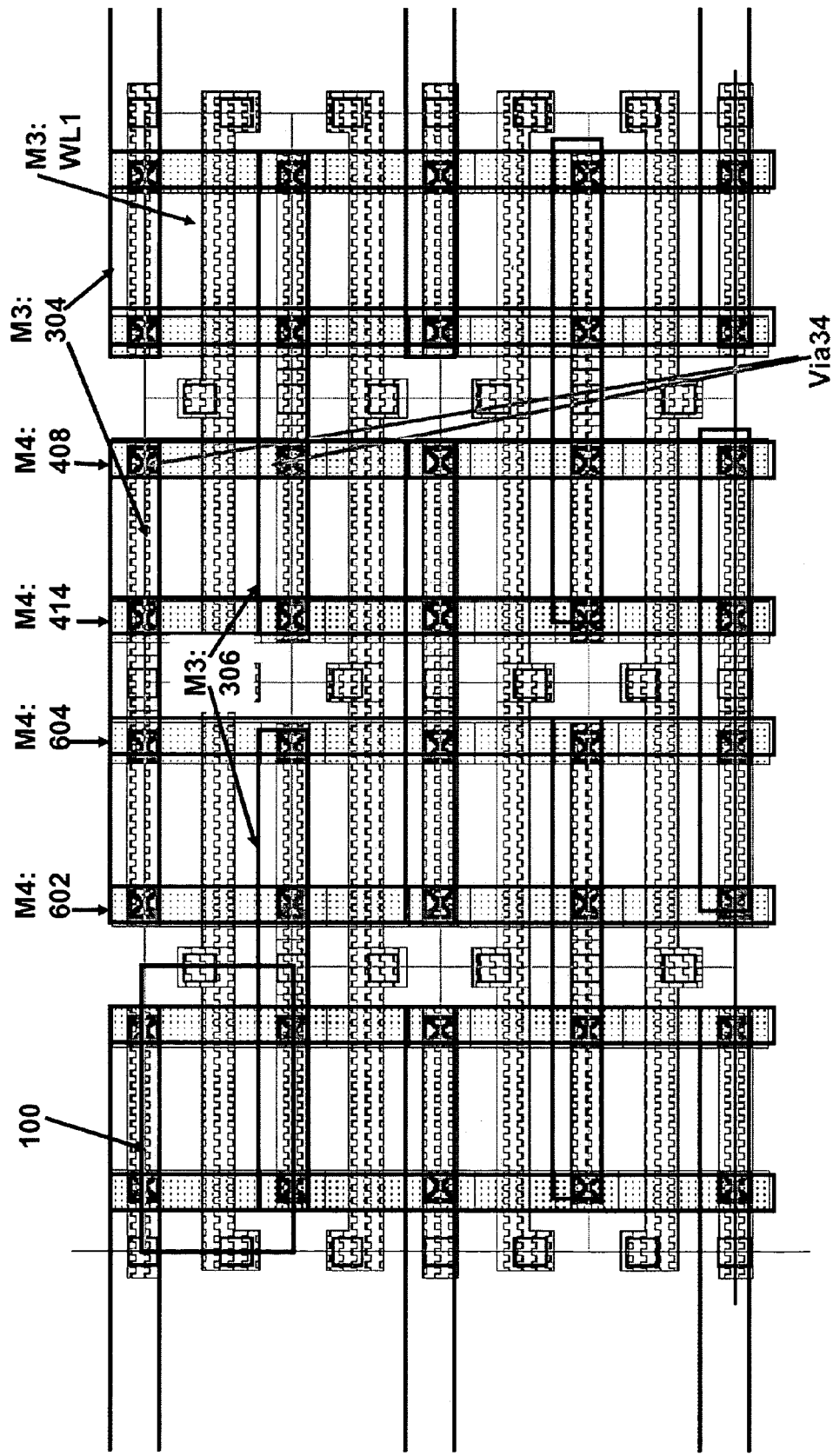
FIG. 6 illustrates a memory array of memory cells with improved power grid design.

FIG. 6 illustrates a memory array of memory cells with an improved power grid design. Memory array 600 is a 4×3 memory cell array that comprises twelve unit memory cells 100. A plurality of discontinuous voltage lines, Vss, are separated by the word lines of memory cells array 600. For example, Vss 304 and 306 are separated by WL1. The discontinuous portions of Vss 304 and 306 are located near the boundaries of each memory cell 100. The discontinuous voltage lines, including Vss 304, 306 are parallel to the word line, in this example, WL1. The discontinuous voltage lines and the word lines are located in the third metal layer M3.

In addition, a plurality of second voltage lines, Vss, are included in memory array 600. The plurality of second voltage lines are located in the fourth metal layer and are perpendicular to the word lines. For example, Vss 414, 408, 602 and 604 are all perpendicular to word line WL1. In an illustrative embodiment, Vss line 414 and 408 are electrically coupled to Vss lines 304 and 306 via contacts between the third and fourth metal layers (Via34). In an alternative embodiment, Vss lines 304, 306, 414, and 408 are electrically coupled to each other and to a Vss node, such as Vss 155.

Figure 7:
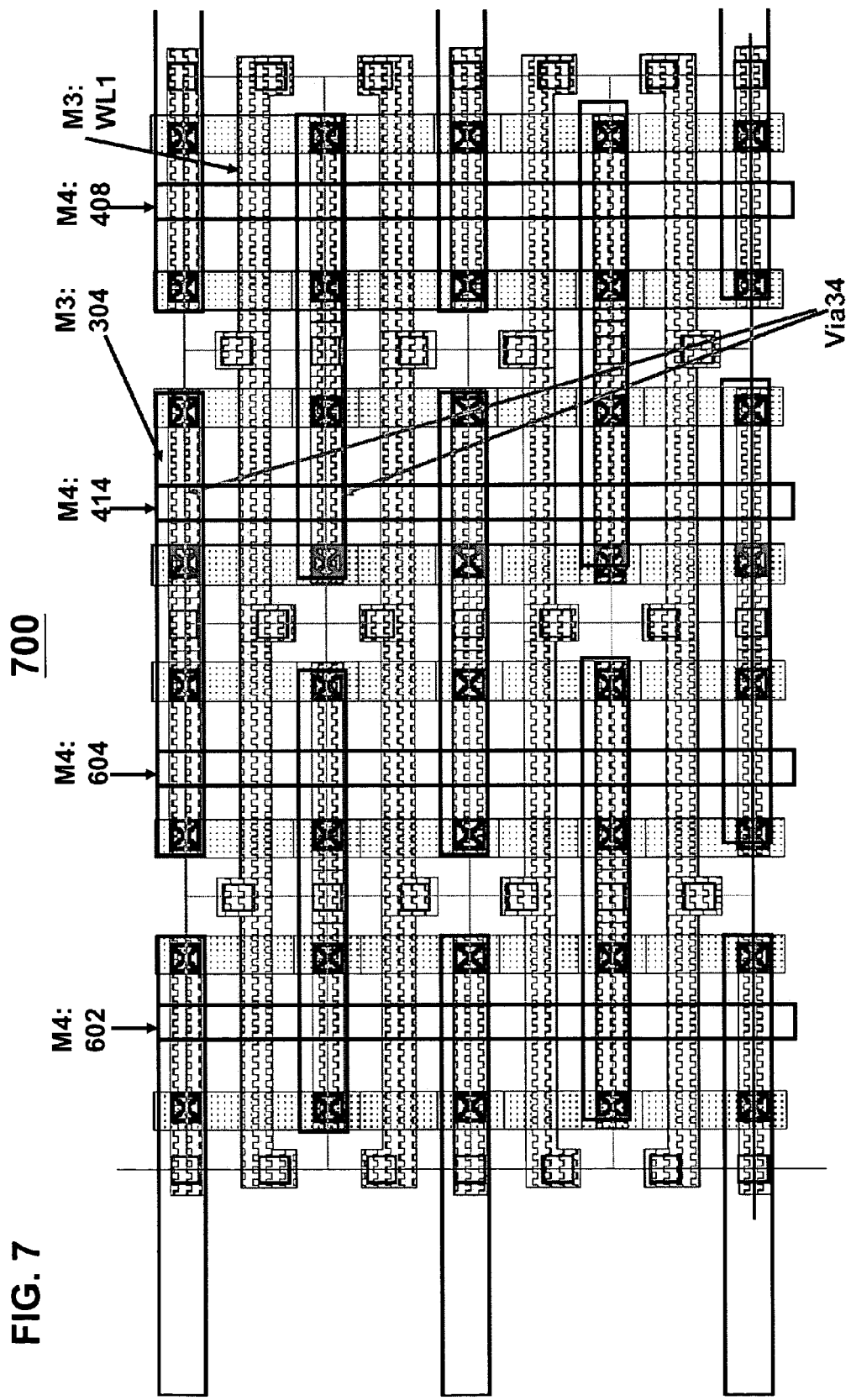
FIG. 7 illustrates another memory array of memory cells with an improved power grid design.

FIG. 7 illustrates another memory array of memory cells with an improved power grid design. Memory cell array 700 is also a 4×3 memory cell array that comprises twelve unit memory cells 100. The plurality of second voltage lines, Vss, are located at different positions in the fourth metal layer. In this example, instead of directly on top of the bit lines and complementary bit lines, Vss 602, 604, 414, and 408 are located between the bit lines and the complementary bit lines. Vss line 414 and 408 are electrically coupled to Vss lines 304 and 306 via contacts between the third and fourth metal layers (Via34).

Figure 8:
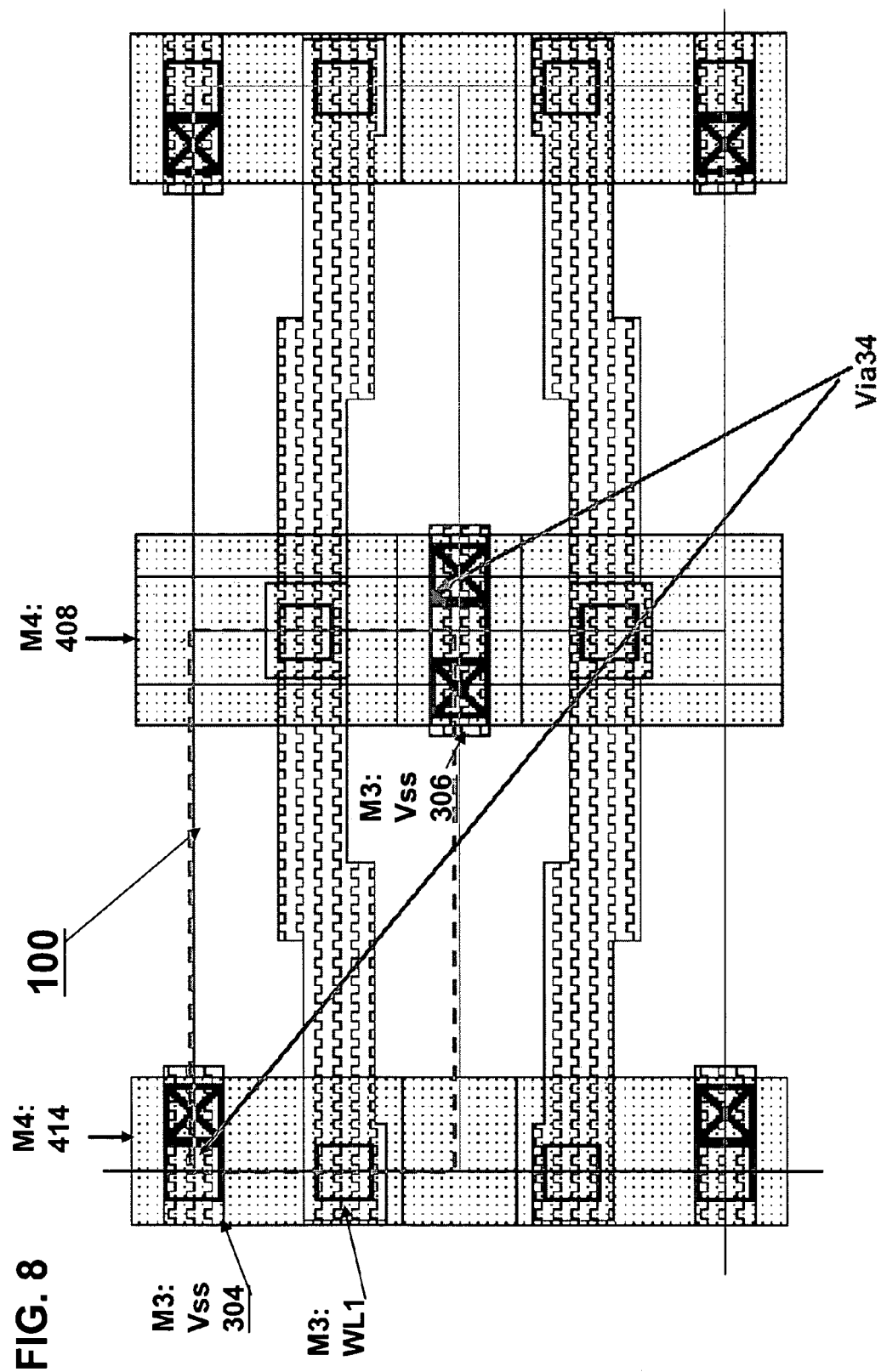
FIG. 8 shows a more detailed layout view of a memory cell with an improved power grid design that minimizes word line coupling capacitance.

FIG. 8 shows a more detailed layout view of a memory cell with an improved power grid design that minimizes word line coupling capacitance. As shown in FIG. 5, each unit memory cell 100 comprises a third metal layer that serves as a conductive layer for word line and Vss lines. In this example, within the third metal layer, unit memory cell 100 comprises Vss lines 304 and 306. Vss lines 304 and 306 are shorter than Vss lines 304 and 306 in FIG. 5 and are discontinuous and have lengths across two unit memory cells. In addition, Vss lines 304 and 306 follow the direction of word line WL1, which is a horizontal direction. Word line WL1 has a bent shape and is located between Vss lines 304 and 306.

In addition to Vss lines 304 and 306, unit memory cell 100 comprises a fourth metal layer, which serves as a higher conductive layer for Vss. The fourth metal layer is located upon the third metal layer, and comprises Vss line 414 and 408. Vss lines 414 and 408 are continuous and follow a direction that is perpendicular to word line WL1. In an illustrative embodiment, Vss line 414 and 408 are electrically coupled to Vss lines 304 and 306 via contacts between third and fourth metal layers (Via34). In one embodiment, all of Vss lines 304, 306, 414, and 408 are electrically coupled to each other and to a Vss node, such as Vss 155. In this example, due to the larger space between Vss lines 414, and 408 created by shorter Vss 304 and 306, the word line capacitance may be minimized.

Figure 9:
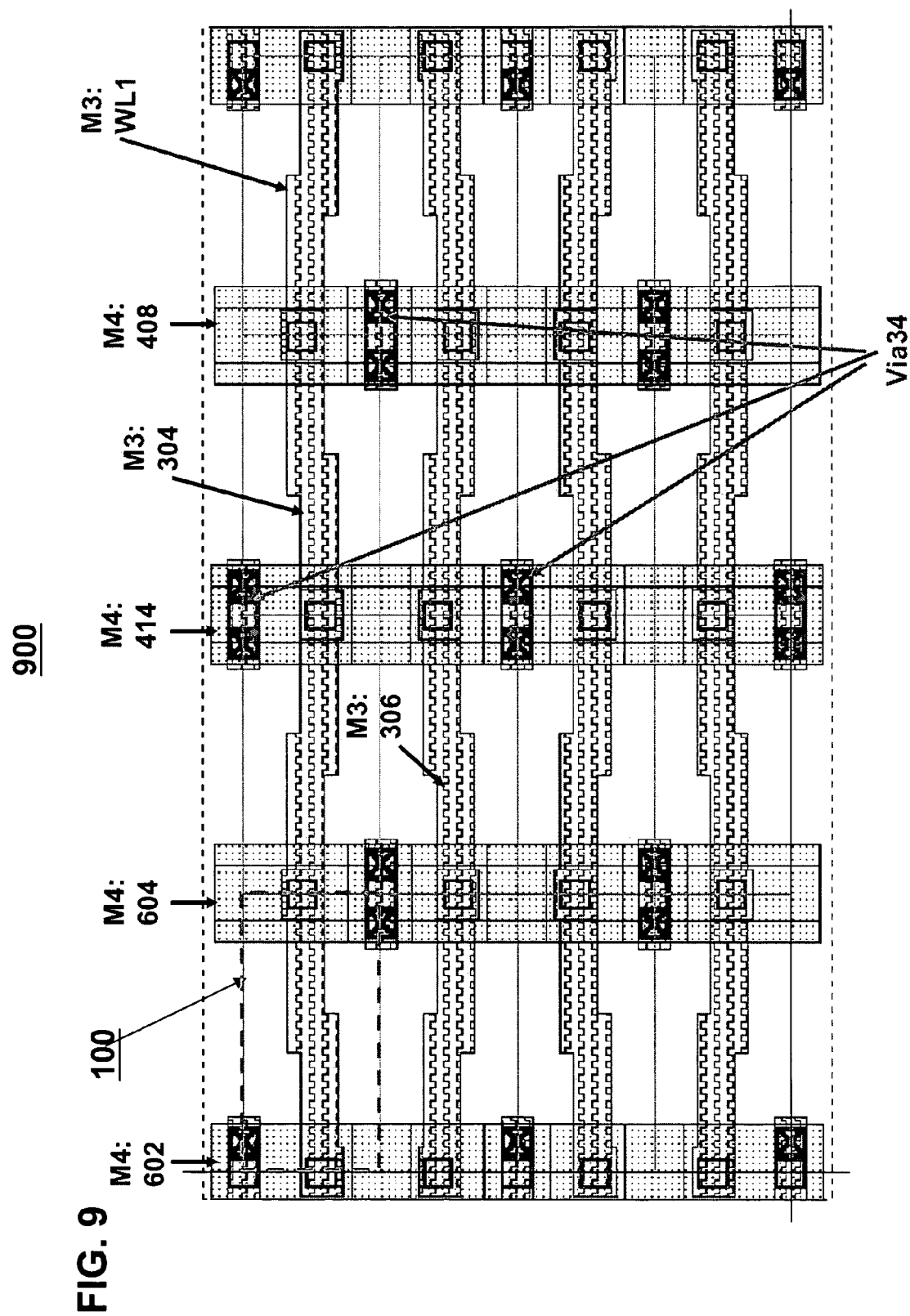
FIG. 9 illustrates a memory array of memory cells with an improved power grid design that minimizes word line coupling capacitance.

FIG. 9 illustrates a memory array of memory cells with an improved power grid design that minimizes word line coupling capacitance. Memory array 900 is a 4×3 memory cell array that comprises twelve unit memory cells 106. A plurality of discontinuous voltage lines, Vss, are separated by the word lines of memory cells array 900. For example, Vss 304 and 306 are separated by WL1. The discontinuous portions of Vss 304 and 306 are located near the boundaries of each memory cell 100. The discontinuous voltage lines, including Vss 304, 306 are parallel to the word line, in this example, WL1. The discontinuous voltage lines and the word lines are located in the third metal layer M3.

In addition, a plurality of second voltage lines, Vss, are included in memory array 900. The plurality of second voltage lines are located in the fourth metal layer and are perpendicular to the word lines. For example, Vss 414, 408, 602 and 604 are all perpendicular to word line WL1. In an illustrative embodiment, Vss line 414 and 408 are electrically coupled to Vss lines 304 and 306 via contacts between the third and fourth metal layers (Via34). In an alternative embodiment, Vss lines 304, 306, 414, and 408 are electrically coupled to each other and to a Vss node, such as Vss 155.

In summary, aspects of the present disclosure provides an improved power grid design for split-word line style memory cell. The memory cell structure has discontinuous ground lines in the third metal layer, bent-shaped word lines with small jog shapes located closely to end portions of the discontinuous ground lines. By having discontinuous ground lines, land margin issue may be minimized since more landing margin is now present between the word line conductive layer and the gate electrode of the pass gate device. In addition, the improved power grid design includes a fourth metal layer that comprises continuous ground lines that are electrically coupled and perpendicular to the discontinuous ground lines in the third metal layer. This memory cell structure provides a lower RC delay and better stability. Furthermore, an improved power grid design with short Vss lines is illustrated, which minimizes the word line capacitance.

The layers described here are illustrative only and not meant to be limiting. The signal lines could be on any layer and can move to any adjacent, or non-adjacent layer to accomplish the twist. Additionally, this disclosure could be practiced on an array of any size with any memory cell and is not limited to the dual port arrangement shown in this embodiment.

What is claimed is:

1. An array of memory cells comprising:
   a first metal layer for local interconnections;
   a second metal layer for a bit line, a complementary bit line, and a first voltage line located between the bit line and the complementary bit line;
   a third metal layer for a first plurality of second voltage lines, and a word line located between the first plurality of second voltage lines, each running substantially in a first direction; and
   a fourth metal layer for a second plurality of second voltage lines, each running in a second direction orthogonal to the first direction.

2. The array of claim 1, wherein each of the first plurality of second voltage lines comprises discontinuous portions located near a boundary of a memory cell in the array.

3. The array of claim 1, wherein each of the first plurality of second voltage lines has a length across two cells in the array.

4. The array of claim 1, wherein the word line has a bent shape.

5. The array of claim 1, wherein the first voltage line runs in the second direction.

6. The array of claim 1, wherein the first plurality of second voltage lines are electrically coupled to the second plurality of second voltage lines.

7. The array of claim 1, wherein the bit line, the complementary bit line, and the first voltage line each runs in the second direction.

8. The array of claim 1, wherein the word line comprises a plurality of jog shapes at boundaries of a memory cell in the array.

9. The array of claim 8, wherein a contact between the second metal layer and the third metal layer is located at each of the plurality of the jog shapes.

10. The array of claim 8, wherein the plurality of jog shapes are located closely in proximity to discontinuous portions of the first plurality of second voltage lines.

11. The array of claim 1, wherein the fourth metal layer further comprises a third voltage line.

12. The array of claim 11, wherein the third voltage line runs in the second direction and is electrically coupled to the first voltage line.

13. The array of claim 1, wherein the first plurality of second voltage lines and the second plurality of second voltage lines are electrically coupled to a ground node.

14. The array of claim 1, wherein each memory cell in the array comprises a plurality of cross-coupled inverters having a data storage node and a data bar storage node.

15. The array of claim 14, wherein each of the plurality of cross-coupled inverters comprises a pull down device and a pull up device.

16. The array of claim 15, wherein one of the first plurality of second voltage lines is electrically coupled to a source node of the pull down device.

17. The array of claim 1, wherein each memory cell in the array further comprises a pass gate device for read write switching.

18. The array of claim 1, wherein each memory cell in the array further comprises a N_well region between a plurality of P_well regions.

19. The array of claim 18, wherein the third metal layer is a conductive layer for a P_well voltage conductive line, and wherein the P_well voltage conductive line runs in the first direction.

20. The array of claim 18, wherein the third metal layer is a conductive layer for a N_well voltage conductive line, and wherein the N_well voltage conductive line runs in the first direction.

21. An array of memory cells comprising:
- a first metal layer for local interconnections;
- a second metal layer for a bit line, a complementary bit line, and a first conductor located between the bit line and the complementary bit line;
- a third metal layer for a first plurality of second conductors, and a word line located between the first plurality of second conductors, each running substantially in a first direction; and
- a fourth metal layer for a second plurality of second conductors, each running in a second direction orthogonal to the first direction.

* * * * *